(12) United States Patent
Yanagisawa et al.

(10) Patent No.: US 8,657,609 B2
(45) Date of Patent: Feb. 25, 2014

(54) SEAL STRUCTURE FOR ELECTRONIC CONTROL DEVICE

(75) Inventors: Yuichi Yanagisawa, Maebashi (JP); Yoshio Kawai, Ota (JP); Hironori Ohhashi, Isesaki (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 13/609,555

(22) Filed: Sep. 11, 2012

(65) Prior Publication Data

US 2013/0069320 A1    Mar. 21, 2013

(30) Foreign Application Priority Data

Sep. 21, 2011    (JP) .................. 2011-205473

(51) Int. Cl.
*H01R 12/00*    (2006.01)
(52) U.S. Cl.
USPC ........................................... 439/79; 439/936
(58) Field of Classification Search
USPC ............... 439/79, 519–521, 587, 589, 936
See application file for complete search history.

(56) References Cited

U.S. PATENT DOCUMENTS

| | | | |
|---|---|---|---|
| 7,144,275 B2 | 12/2006 | Iida | |
| 7,419,385 B2 | 9/2008 | Itou et al. | |
| 8,107,251 B2 | 1/2012 | Yamauchi | |
| 2009/0068862 A1 | 3/2009 | Honda | |

FOREIGN PATENT DOCUMENTS

| | | |
|---|---|---|
| JP | 2001-085858 | 3/2001 |
| JP | 2006-100252 | 4/2006 |
| JP | 2007-234429 | 9/2007 |
| JP | 2009-70855 A | 4/2009 |
| JP | 2009-230925 | 10/2009 |
| JP | 2010-258360 A | 11/2010 |
| JP | 2011-49312 A | 3/2011 |
| JP | 2011-60618 A | 3/2011 |

OTHER PUBLICATIONS

U.S. Appl. No. 13/609,597, filed Sep. 11, 2012.
U.S. Appl. No. 13/609,684, filed Sep. 11, 2012.

*Primary Examiner* — Khiem Nguyen
(74) *Attorney, Agent, or Firm* — Crowell & Moring LLP

(57) ABSTRACT

Seal structure for electronic control device having a seal portion formed between an outer peripheral surface of a connector and an inner peripheral surface of a housing, and provided with a seal groove and a protruding line. The seal portion has a deep bottom portion having a seal groove, a shallow bottom portion whose seal groove is shallower than that of the deep bottom portion, and a connecting portion connecting these deep and shallow bottom portions. Width of the seal groove of the shallow bottom portion is set to be larger than the deep bottom portion As a position of a seal groove of the connecting portion gets closer to the deep bottom portion from the shallow bottom portion, depth of the seal groove of the connecting portion is set to be gradually larger, and width of the seal groove of the connecting portion is set to be gradually smaller.

3 Claims, 5 Drawing Sheets

SEAL STRUCTURE FOR ELECTRONIC CONTROL DEVICE

BACKGROUND OF THE INVENTION

The present invention relates to a seal structure for an electronic control device, which is favorable for an engine control unit or an automatic transmission control unit.

As an example of the seal structure for the electronic control device, it is disclosed in Japanese Patent Provisional Publication No. 2009-070855 (hereinafter is referred to as "JP2009-070855"). In JP2009-070855, the seal structure of a connector part of a so-called connector-side-mounted type of electronic control device, in which a part of the connector fixed to one side of a circuit board is exposed to an outside of a casing from a window of the casing, is disclosed. Both upper and lower surfaces of the connector are sandwiched between and by a pair of members of the casing from width direction of the circuit board. Then, a connector seal portion, which is filled with a sealing material, is provided at a fitting surface portion between an outer peripheral surface of the connector and an inner peripheral surface of the casing throughout the entire circumference of the connector. This connector seal portion is formed by a seal groove and a protruding line which are provided respectively at one side and the other side of the connector and the casing so as to secure a predetermined seal length (also called a leak path). A U-shaped gap formed between these seal groove and protruding line is filled with the sealing material.

SUMMARY OF THE INVENTION

In JP2009-070855, however, in the case where such connector seal portion having the seal groove and the protruding line is formed throughout the entire circumference of the connector, the casing that covers the connector increases in size by a depth of the seal groove, then the casing becomes larger. This causes increase in size of the electronic control device, and ease of installation or workability of installation of the electronic control device in an engine room etc. is deteriorated.

It is therefore an object of the present invention to provide a seal structure for the electronic control device, which is capable of achieving the size reduction of the electronic control device without losing sealing performance.

According to one aspect of the present invention, a seal structure for an electronic control device having a circuit board to which, at one side thereof, a connector is fixed and a housing having a pair of members that sandwich the connector in a thickness direction, and a part of the connector being exposed to an outside of the housing and a remaining part of the connector and the circuit board being housed in a watertight space of an inside of the housing, the seal structure comprises: a seal portion formed at a fitting surface portion between an outer peripheral surface of the connector and an inner peripheral surface of the housing in a circumferential direction of the connector, and provided with a seal groove formed at one side of the outer peripheral surface of the connector and the inner peripheral surface of the housing and a protruding line formed at the other side. A gap defined by fitting of the protruding line and the seal groove is filled with a sealant. And the seal portion has (a) a deep bottom portion where a seal groove having a predetermined depth is formed; (b) a shallow bottom portion whose seal groove is set to be shallower than the seal groove of the deep bottom portion; and (c) a connecting portion which connects the deep bottom portion and the shallow bottom portion. And a width of the seal groove of the shallow bottom portion is set to be large as compared with the deep bottom portion so that a seal length is constant between the deep bottom portion, the shallow bottom portion and the connecting portion. And, as a position of a seal groove of the connecting portion gets closer to the deep bottom portion from the shallow bottom portion, a depth of the seal groove of the connecting portion is set to be gradually larger, and a width of the seal groove of the connecting portion is set to be gradually smaller.

The other objects and features of this invention will become understood from the following description with reference to the accompanying drawings.

BRIEF DESCRIPTION OF THE DRAWINGS

FIG. 5A is a sectional view, taken along an A-A line of FIG. 1, of a lower surface side of the connector. FIG. 5B is a sectional view, taken along a B-B line of FIG. 1, of a side surface side of the connector. FIG. 5C is a sectional view, taken along a C-C line of FIG. 1, of an upper surface side of the connector.

DETAILED DESCRIPTION OF THE INVENTION

Figure 1:
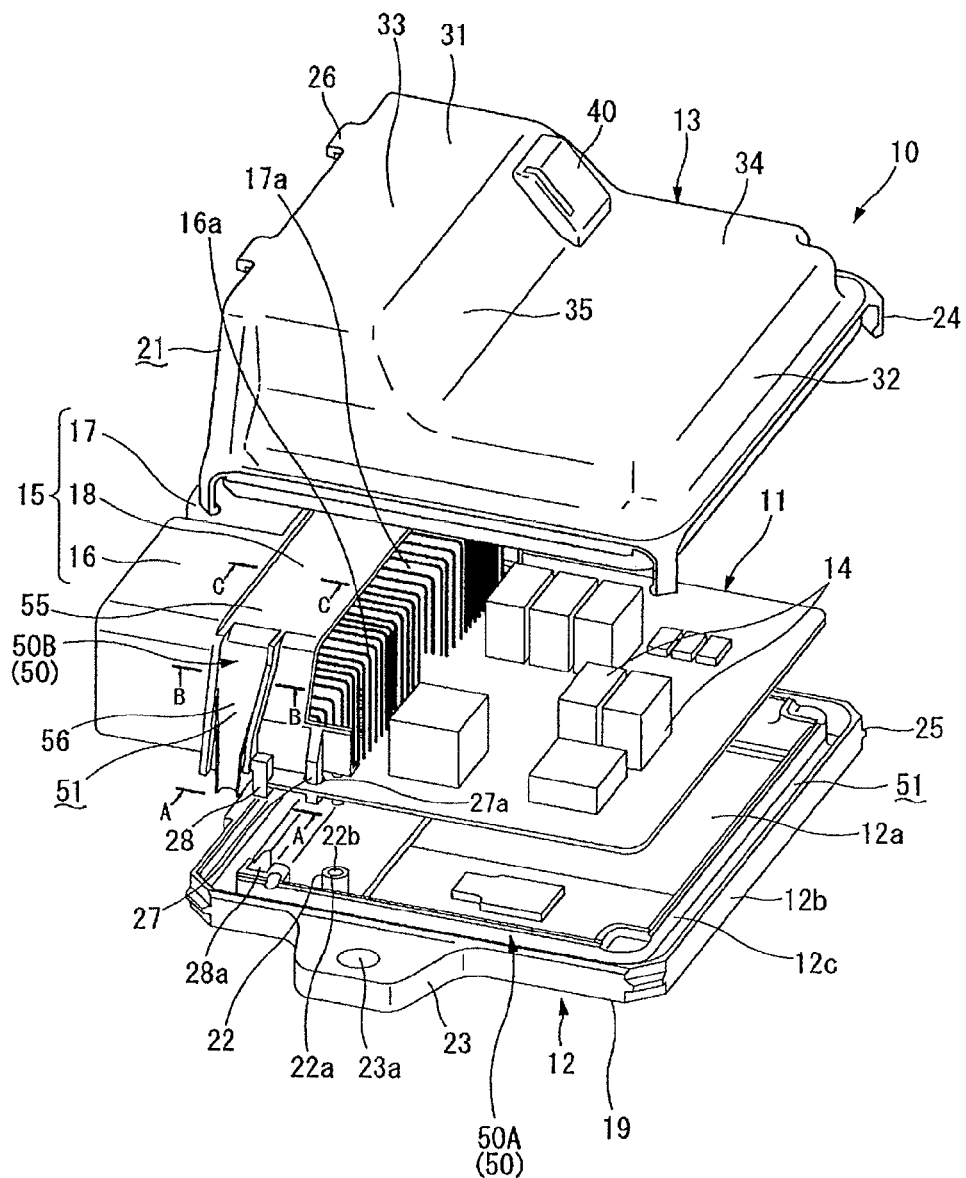
FIG. 1 is a perspective exploded view of an electronic control device that employs a seal structure of a first embodiment of the present invention.

According to the present invention, by providing a shallow bottom portion whose seal groove is shallow, it is possible to suppress the decrease in the sealing performance with constant seal lengths secured between the shallow bottom portion, a deep bottom portion and a connecting portion while achieving the size reduction of the electronic control device and improving the workability of installation of the electronic control device.

Embodiments of a seal structure for the electronic control device of the present invention will now be explained below with reference to the drawings.

In the following description, a case where the seal structure for the electronic control device is employed in an engine control unit of a vehicle will be explained in detail.

First, a basic configuration of an electronic control device 10 will be explained with reference to FIGS. 1 and 2. Here, for convenience of the explanation, an up-and-down direction (a vertical direction) in FIG. 1, i.e. a thickness direction of a circuit board 11, is defined as an up-and-down direction (a vertical direction) and a height direction of the electronic control device 10. However, this direction does not necessarily correspond to a vertical direction when mounted in the vehicle.

The electronic control device 10 mainly has a housing formed by a substantially plate-shaped case 12 and a substantially box-shaped cover 13 and the circuit board 11 on which an electron element or component (or electronic parts) 14 is mounted. The case 12 that is fixed to a vehicle body side and the cover 13 are liquid-tightly fitted together, then the housing having the liquid tightness is formed. The circuit board 11 (the electronic parts 14) is housed in a watertight space of an inside of the housing. The electronic control device 10 is installed inside an engine room (not shown) etc. with a clamping or mounting flat surface 19, which is a bottom surface of the case 12, fixed to the vehicle body side.

Each element or component will be explained in more detail. The circuit board 11 is a so-called printed circuit board that mounts some electronic parts 14 on its front and/or back surfaces. Wiring circuit pattern is formed on plate-shaped front and/or back surfaces made of e.g. glass epoxy resin or is formed inside the front and/or back surfaces, then the electronic parts 14 are electrically connected to the wiring circuit pattern with solder. As the electronic parts 14, for instance, they are a capacitor, a coil, a transistor, an IC and so on. In FIG. 1, for the sake of convenience, only electronic parts 14 whose heat-generation is relatively high (e.g. MOS-FET and IC) are illustrated.

As shown in FIG. 1, a surface-mounted-type of connector 15 having first and second connecting opening ends 16 and 17 is attached or fixed to one side of the circuit board 11. Two of the first and second connecting opening ends 16, 17 are connected to respective external connectors. This connector 15 is a connector that is made of synthetic resin by which the two connecting opening ends 16, 17 split according to the external connectors are integrally joined together through a joining base 18. The connector 15 is fixed to the circuit board 11 through this joining base 18 with a plurality of screws etc. The connector 15 is arranged so that a series of connecting opening ends 16, 17 joined by the joining base 18 face an outside through a window 21 that is an opening formed between the case 12 and the cover 13. The connecting opening ends 16, 17 are connected to the respective external connectors (not shown) at this window 21. These connecting opening ends 16, 17 and the joining base 18 of the connector 15 are integrally formed together by synthetic resin material.

The connector 15 is provided with a plurality of male terminals 16a and 17a that are electrically connected to the wiring circuit pattern on the circuit board 11. These male terminals 16a, 17a are respectively connected to a plurality of female terminals housed in the external connectors (not shown), the connector 15 is thus electrically connected to sensors and equipment such as a pump, each of which is connected to the external connector (the female terminal).

The joining base 18 of the connector 15 is provided with a positioning protrusion 27 that is inserted into a positioning hole 27a formed on the circuit board 11. Further, the joining base 18 is provided with a positioning protrusion 28 that is fitted into a positioning recessed portion 28a formed in the case 12.

The case 12 is a case that is formed into the substantially plate-shape by metal material such as iron and aluminum having excellent heat-dissipation. More specifically, the case 12 is formed, as an integral part, into such a shallow-bottomed box-shape that a periphery edge of the case 12 slightly stands. As shown in FIG. 1, a side wall 12b is formed at an outer periphery edge (at each side) of a substantially rectangular bottom wall 12a in such a manner that the whole of case 12 slightly opens upwards.

Further, a board fixing portion 22 for fixing the circuit board 11 is provided on an inner side surface of the bottom wall 12a of the case 12. The board fixing portion 22 has, on an upper end thereof, a flat supporting surface 22a that supports the circuit board 11, and a female screw hole 22b into which a screw (not shown) is screwed for fixing the circuit board 11 is formed at the supporting surface 22a. The screw is screwed into each female screw hole 22b, thereby fixing the circuit board 11 to the case 12 with the circuit board 11 supported by each board fixing portion 22.

Furthermore, a pair of brackets 23 for fixing the electronic control device 10 to the vehicle body (not shown) are formed integrally with an outer side part of the side wall 12b of the case 12. Here, in FIG. 1, only one bracket 23 positioned at a front side in the drawing is illustrated. The bracket 23 is provided with a penetration hole 23a that penetrates the bracket 23 in the vertical direction and a cutting groove that opens towards the side of the case 12. The electronic control device 10 is fixed to the vehicle body side with a bolt that is inserted in the penetration hole 23a and the cutting groove.

The cover 13 is a cover that is formed, as an integral part, into the substantially box-shape by certain synthetic resin material that is light and low cost as compared with metal material. The cover 13 has an upper wall 31 that covers an upper side of the circuit board 11 and an upper side of the connector 15 and a side wall 32 that surrounds three sides of a periphery edge of the upper wall 31 except the window 21. A stopper hook 24 provided at each of four corners of the cover 13 is fitted onto a protrusion 25 provided at each of four corners of the case 12 by elastic deformation of the stopper hook 24, and also each connector stopper hook 26 provided at two positions of a periphery edge of the window 21 is fitted onto a protrusion (not shown) provided at the connector 15 side by elastic deformation of the connector stopper hook 26. The cover 13 is then firmly attached or secured to the case 12 and the circuit board 11 including the connector 15. A fixing structure of the cover 13 is such snap-fit type fixing structure as described above.

As explained above, in the present embodiment, as the fixing structure of the housing, the snap-fit type fixing structure which is a simple structure using the elastic deformation of the synthetic resin cover 13 is employed. However, the fixing structure is not limited to this structure. For instance, other fixing structure using a screw or a bolt could be used.

This electronic control device 10 employs a so-called connector-side-mounted structure in which a part of the connector 15 fixed to the one side of the circuit board 11 penetrates the window 21 provided at a side of the housing and is exposed to an outside of the housing. Because of this structure, the cover 13 has a stepped shape according to heights of the circuit board 11 and the connector 15 whose sizes (heights) in the thickness direction of the circuit board are different from each other. More specifically, the upper wall 31 of the cover 13, which faces the case 12 so as to sandwich the circuit board 11 and the connector 15, has an upper section 33 and a lower section 34, each of which is parallel to the mounting flat surface 19 of the case 12. A size (height) in the thickness direction of the circuit board of the upper section 33 that covers the upper side of the connector 15 is set to be larger (or higher) than that of the lower section 34 that covers the upper side of the circuit board 11. The upper wall 31 further has a sloped wall section 35 that smoothly or seamlessly unites these upper and lower sections 33 and 34 having different height. This sloped wall section 35 has a predetermined inclination angle with respect to the mounting flat surface 19 of the case 12. More specifically, the sloped wall section 35 inclines at a substantially 45-degree flat inclination angle.

Therefore, the sloped wall section 35 inclines at the same inclination angle with respect to the upper section 33 and the lower section 34.

The sloped wall section 35, which serves as part of an exterior wall of the housing, is provided with a protection wall 40. An air vent (not shown) for ventilation of the inside of the housing is formed at an inner side of the protection wall 40 so as to penetrate the sloped wall section 35 in the thickness direction. The air vent is provided with a breathable waterproof thin film such as Gore-Tex (registered trademark) which has both water-resistance and air-permeability. The protection wall 40 covers the air vent and its surroundings in order to prevent the breathable waterproof thin film from being directly sprayed with high temperature—high pressure water during car wash etc.

Next, the seal structure of the first embodiment will be explained with reference to FIG. 1 to FIG. 5C. In order to ensure the water-resistance of the inside of the housing, a seal portion 50 which is filled with a sealing material (sealant) is provided at a fitting surface portion between the components. More specifically, a housing seal portion 50A filled with the sealant is provided at a fitting surface portion that is a mating surface portion between the periphery edge of an upper surface side of the case 12 and the periphery edge of a lower surface side of the cover 13 throughout the entire circumference of the housing. In addition, a connector seal portion 50B filled with the sealant is also provided at a fitting surface portion between an outer peripheral surface of the connector 15 and an inner peripheral surface of the window 21 of the housing throughout the entire circumference of the connector 15. The housing seal portion 50A and the connector seal portion 50B are a common seal portion at a lower surface side of the connector 15. That is, the seal portion 50 positioned under the connector 15 serves as a part of the housing seal portion 50A and also as a part of the connector seal portion 50B.

As the sealant, its constituent element is not specially limited as long as the sealant has fluidity. For example, epoxide sealant, silicon sealant and acrylic sealant could be selected as the sealant in accordance with specs or requirements of the electronic control device 10.

Regarding the housing seal portion 50A, a channel-shaped seal groove 51 which is shaped like a square bracket ([) in cross section is formed at the case 12 side throughout the entire circumference of the case 12. Further, a band-shaped protruding line 52 whose cross section is a rectangle is formed at the lower surface side of the cover 13 and the lower surface side of the connector 15. This protruding line 52 is fitted in the seal groove 51 with a predetermined gap provided between the protruding line 52 and the seal groove 51. This gap is a U-shaped gap (U-shaped cross section gap, whose cross section is U-shape), and a sealing material (sealant) 53 fills this U-shaped gap.

Figure 2:
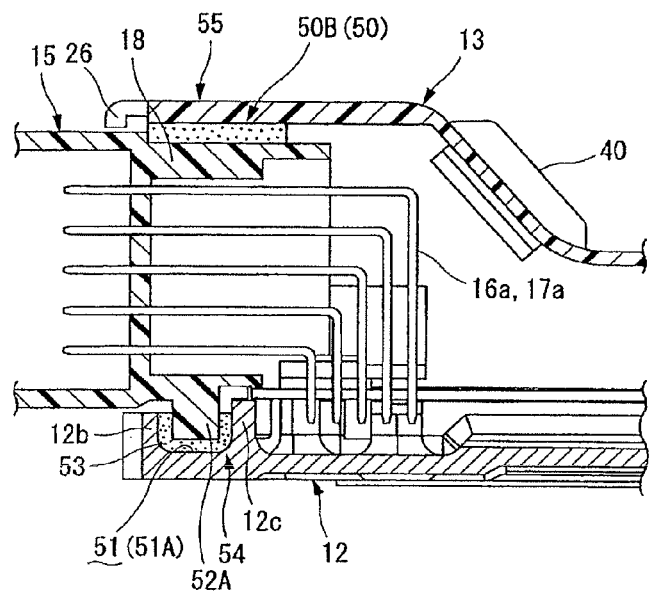
FIG. 2 is a sectional view showing the seal structure of a connector part, of the first embodiment.

As shown in FIGS. 1 and 2, the seal groove 51 formed at the case 12 is defined between the side wall 12b of the case 12 and an auxiliary wall 12c that stands from the bottom wall 12a at an inner peripheral side of the side wall 12b. On the other hand, the protruding line 52 formed at the cover 13 is formed as an integral part upon molding the synthetic resin cover 13, and protrudes downwards from the lower surface of the cover 13. Likewise, the protruding line 52 formed at the connector 15 is formed as an integral part upon molding the synthetic resin connector 15, and protrudes downwards from a lower surface of the joining base 18 of the connector 15.

In this manner, the seal portion 50 is provided with the seal groove 51 and the protruding line 52, and the cross section of the gap filled with the sealant 53 is shaped into the U-shape, thereby securing a sufficient seal length (also called a leak path) and getting intended or desired sealing performance.

With respect to the housing seal portion 50A, a depth and a width of each of the seal groove 51 and the protruding line 52 are set to be substantially uniform throughout the entire circumference so as to secure a predetermined constant seal length.

Here, the "seal length" corresponds a filling length of the sealant existing between two gaps that are separated by the seal portion 50. For instance, in FIG. 5A, the seal length corresponds a length (R2+(R1×2)) obtained by developing or converting the U-shaped gap filled with the sealant 53 to a linear length.

As for the connector seal portion 50B, as same as the housing seal portion 50A, the seal groove 51 and the protruding line 52 are formed. Under the connector 15 (at the lower surface side of the connector 15) where the connector seal portion 50B serves also as a part of the housing seal portion 50A (and vice versa), as shown in FIG. 2, the protruding line 52 (52A) is provided at the connector 15 side, then this protruding line 52 (52A) is fitted in the seal groove 51 (51A) formed at the case 12. On the other hand, regarding surfaces (connector both sides) except the lower surface side of the connector 15, the seal groove 51 is formed at the connector 15 side, and the protruding line 52 is formed at the cover 13 side which faces this seal groove 51.

Figures 5A, 5B, 5C:
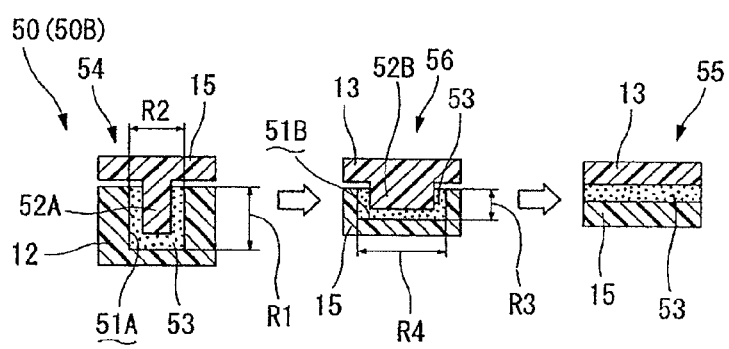
FIGS. 5A, 5B and 5C are sectional views of a connector seal portion under the assembly, of the first embodiment.

FIGS. 5A, 5B and 5C are sectional views of the connector seal portion 50B under the assembly. FIG. 5A is a sectional view, taken along an A-A line of FIG. 1, of the lower surface side of the connector 15. FIG. 5B is a sectional view, taken along a B-B line of FIG. 1, of the side surface side of the connector 15. FIG. 5C is a sectional view, taken along a C-C line of FIG. 1, of an upper surface side of the connector 15.

In the present embodiment, a shape and a size of each of the seal groove 51 and the protruding line 52 of the connector seal portion 50B are set to be different according to its position. That is, as shown in FIG. 5A, the lower surface side of the connector 15 is provided with a deep bottom portion 54 which has a seal groove 51A having a predetermined depth R1 and a predetermined width R2 and a band-shaped protruding line 52A fitted in this seal groove 51A with a gap provided between them. An inner surface of the seal groove 51A and an outer surface of the protruding line 52A of the deep bottom portion 54 face each other with a predetermined gap provided between them, then this U-shaped gap is filled with the sealant 53.

On the other hand, as shown in FIG. 5C, the upper surface side of the connector 15 is provided with a shallow bottom portion 55 whose seal groove and protruding line are set to be shallower than those of the deep bottom portion 54 formed at the lower surface side of the connector 15. Especially in the present embodiment, the depth of the seal groove is set to 0 (zero), namely that the seal groove is substantially omitted, and the protruding line fitted in the seal groove is also omitted. Thus, the upper surface side of the connector 15 which would be provided with the shallow bottom portion 55 is sealed by a so-called flat surface seal structure in which a flat band-shaped gap between the outer peripheral surface of the connector 15 and the opposing inner peripheral surface of the cover 13 of the housing is filled with the sealant 53.

As for the both sides of the connector 15, as shown in FIG. 5B, the side surface side of the connector 15 is provided with, at both sides thereof, a connecting portion 56 which connects the connector lower surface side deep bottom portion 54 and the connector upper surface side shallow bottom portion 55.

The deep bottom portion 54, the shallow bottom portion 55 and the connecting portion 56 are set in such a manner that the seal length of the connector seal portion 50B is constant throughout the entire circumference of the connector seal portion 50B (namely that the seal lengths at the deep bottom portion 54, the shallow bottom portion 55 and the connecting portion 56 are set so as to be constant). This will be explained in more detail. The widths of the seal groove and the protruding line of the shallow bottom portion 55 are set to be large as compared with the deep bottom portion 54 so that the both seal lengths are constant.

Further, although the connecting portion 56 is provided with a seal groove 51B and a band-shaped protruding line 52B fitted in this seal groove 51B with a predetermined gap provided as same as the deep bottom portion 54, a depth R3 of the seal groove 51B of the connecting portion 56 is set to be small (shallow) (i.e. R3<R1), also a width R4 of the seal groove 51B of the connecting portion 56 is set to be large (i.e. R4>R2), as compared with the deep bottom portion 54 so that the both seal lengths are constant. The protruding line 52B of the connecting portion 56 is also set according to such shape of the seal groove 51B. That is, a depth of the protruding line 52B is set to be small (shallow), also a width of the protruding line 52B is set to be large, as compared with the deep bottom portion 54.

Furthermore, regarding the connecting portion 56, as a position of the seal groove 51B gets closer to the deep bottom portion 54 from the shallow bottom portion 55, the depth R3 of the seal groove 51B is set to be gradually larger (deeper), and the width R4 of the seal groove 51B is set to be gradually smaller.

Figure 3:
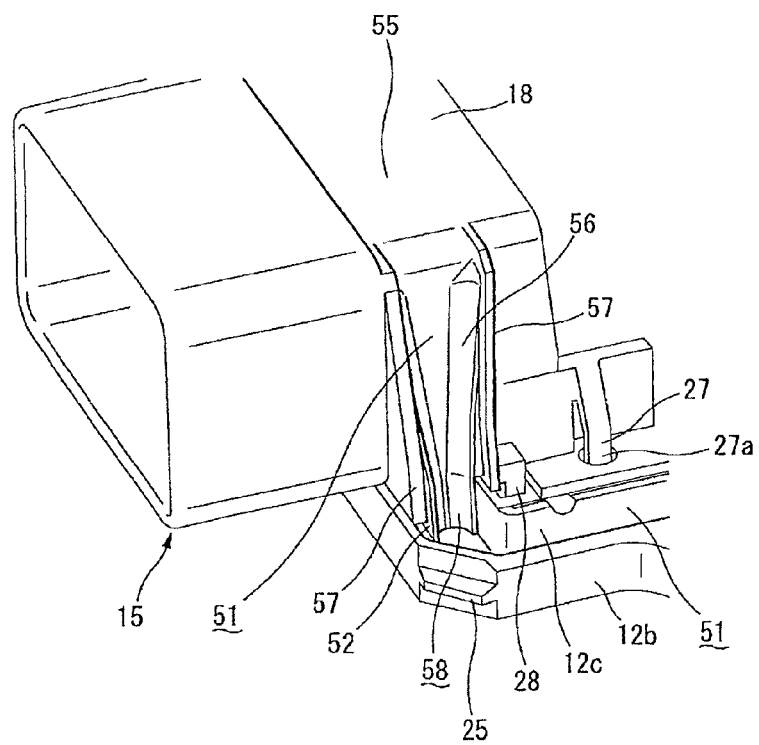
FIG. 3 is a perspective view showing the seal structure of the connector part, with a cover removed, of the first embodiment.
Figure 4:
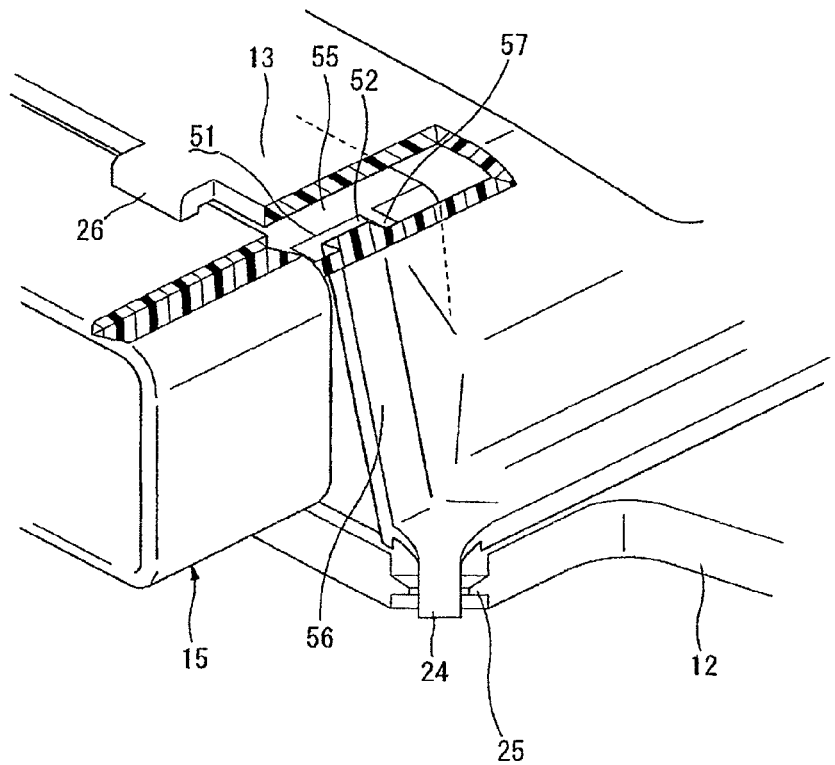
FIG. 4 is a perspective view showing the seal structure of the connector part, with parts of the cover and the connector shown by cutaway, of the first embodiment.

The seal structure of the side surface side of the connector 15 will be further explained with reference to FIGS. 3 and 4. The side surface of the connector 15 is provided with a pair of ribs 57 that are formed as an integral part and overhang outwards. The seal groove 51B of the connecting portion 56 is formed between these ribs 57. Each of the ribs 57 has such substantially triangular-shape that an overhanging depth is gradually deeper towards the connector lower surface from the connector upper surface. A top of the rib 57 smoothly continues to the connector upper surface.

Further, an inner side of the seal groove 51B is provided with a further deeply hollow auxiliary seal groove 58, then the side surface side of the connector 15 has a dual seal structure. The auxiliary seal groove 58 is gradually deeper towards the connector lower surface, and extends up to a portion of the connector lower surface protruding line 52A fitted in the seal groove 51A of the case 12. That is, a part of the auxiliary seal groove 58 is formed also at the protruding line 52 of the lower surface side of the connector 15.

Next, function and effect of the present embodiment will be explained. As described above, in the case of the so-called connector-side-mounted type of electronic control device, like the present embodiment, in which the connector 15 fixed to the one side of the circuit board 11 is sandwiched between the case 12 and the cover 13 which are two of members forming the housing and a part of the connector 15 is exposed to the outside from the side of the housing, in order to ensure the sealing performance of the inside of the housing, the connector seal portion 50B filled with the sealant is provided at the fitting surface portion between the outer peripheral surface of the connector 15 and the inner peripheral surface of the housing throughout the entire circumference of the connector 15.

If a seal groove having a constant depth is provided at the connector seal portion 50B throughout the entire circumference of the connector 15, a physical size around the connector circumference of the housing increases by an amount of this depth of the seal groove, then ease of installation or workability of installation of the electronic control device is deteriorated due to increase in size of the electronic control device. Thus, for instance, in order to suppress or reduce the size in a connector thickness direction, if the depth of the seal groove at the upper or lower surface side of the connector is partly shallow, the seal length (the leak path) of the sealant filling the U-shaped gap between the seal groove and the protruding line is locally shortened, and there is apprehension that the sealing performance of this part will decrease. Further, when the depth of the seal groove is partly shallow, seal length of discontinuity occurs at a connecting part between a part whose seal groove depth is deep and a part whose seal groove depth is shallow. Moreover, since a bump or protuberance or an edge might occur at this connecting part, this causes stress concentration on this part.

In contrast to this, in the present embodiment, the shallow bottom portion 55 whose seal groove is shallow (locally shallow as compared with the deep bottom portion 54 and the connecting portion 56) is provided at the upper surface side, which does not touch the circuit board 11, of the connector 15. Thus, the thickness of the housing is reduced by an amount of the shallow depth of the seal groove, thereby achieving the size reduction of the electronic control device and improving the workability of installation of the electronic control device.

On the other hand, the deep bottom portion 54 having the seal groove 51A whose depth is the predetermined depth R1 is provided at the lower surface side, which is fixed to the circuit board 11, of the connector 15. That is to say, regarding the connector lower surface side, since the connector seal portion 50B serves also as a part of the housing seal portion 50A that seals the fitting surface portion between the case 12 and the cover 13 throughout the entire circumference of the housing, the seal groove 51A having the predetermined depth remains so that the depth R1 of the seal groove 51A provided at the case 12 side is continuously constant throughout the entire circumference of the housing.

Then, the widths of the seal groove and the protruding line of the shallow bottom portion 55 are set to be large as compared with the deep bottom portion 54, and regarding the connecting portion 56, as positions of the seal groove and the protruding line get closer to the deep bottom portion 54 from the shallow bottom portion 55, the depths of the seal groove and the protruding line are set to be gradually larger (deeper), and the widths of the seal groove and the protruding line are set to be gradually smaller so that the seal length of the connector seal portion 50B is constant between the deep bottom portion 54, the shallow bottom portion 55 and the connecting portion 56. With this setting, while securing the predetermined seal length at the connector seal portion 50B throughout the entire circumference of the connector 15, the size in the thickness direction of the housing sandwiching the connector 15 can be reduced by the amount of the shallow depth of the seal groove of the connector upper surface side shallow bottom portion 55. This allows the size reduction of the electronic control device and improvement in the workability of installation of the electronic control device.

Further, with regard to the connecting portion 56 connecting the deep bottom portion 54 and the shallow bottom portion 55, since the depths and the widths of the seal groove and the protruding line are set to be gradually changed, despite the fact that the depth of the seal groove is set to be different between the deep bottom portion 54 and the shallow bottom portion 55 as mentioned above, it is possible to improve the sealing performance and to avoid the occurrence of the stress concentration or reduce the stress concentration while suppressing the occurrence of the bump or protuberance or the edge which is structurally an inflection point.

Especially in the present embodiment, since the shallow bottom portion 55 provided at the connector upper surface side is sealed by a so-called flat surface seal structure in which the seal groove and the protruding line are omitted, the size in the thickness direction of the housing can be further reduced, and the size reduction of the electronic control device is achieved.

Figure 6:
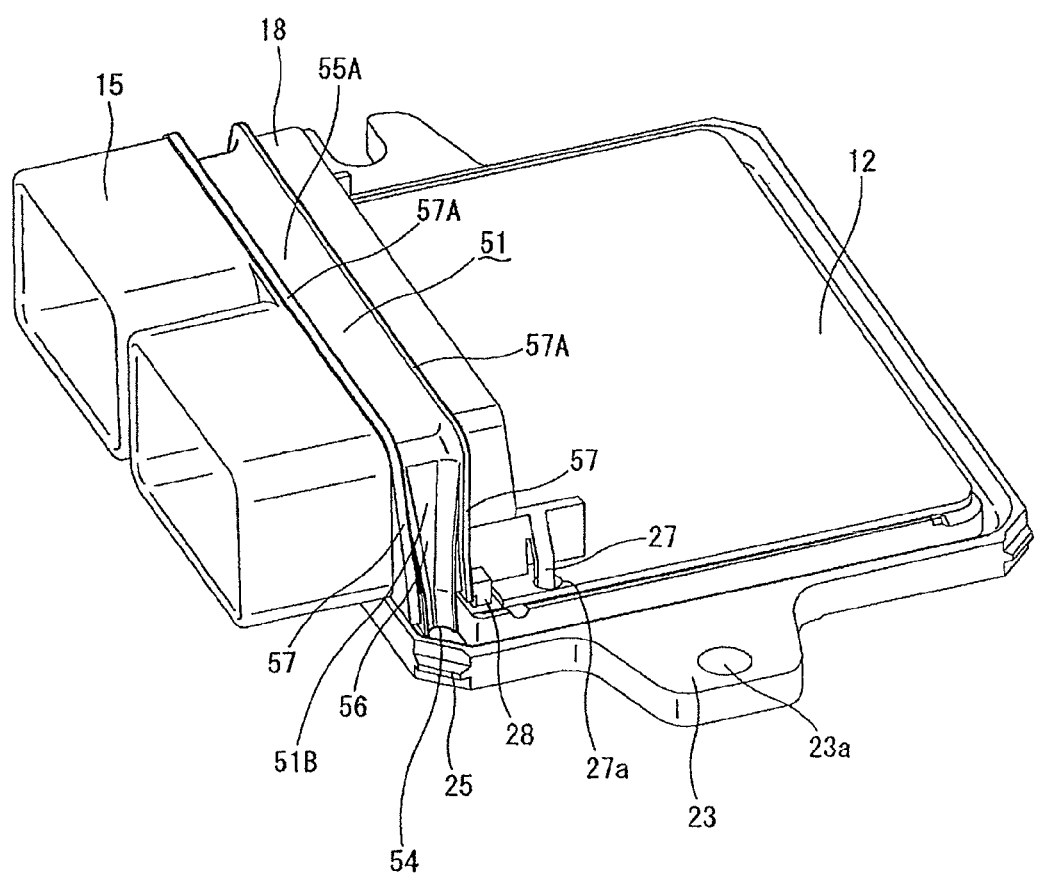
FIG. 6 is a perspective view showing an electronic control device that employs a seal structure, with the cover removed, of a second embodiment of the present invention.
Figure 7:
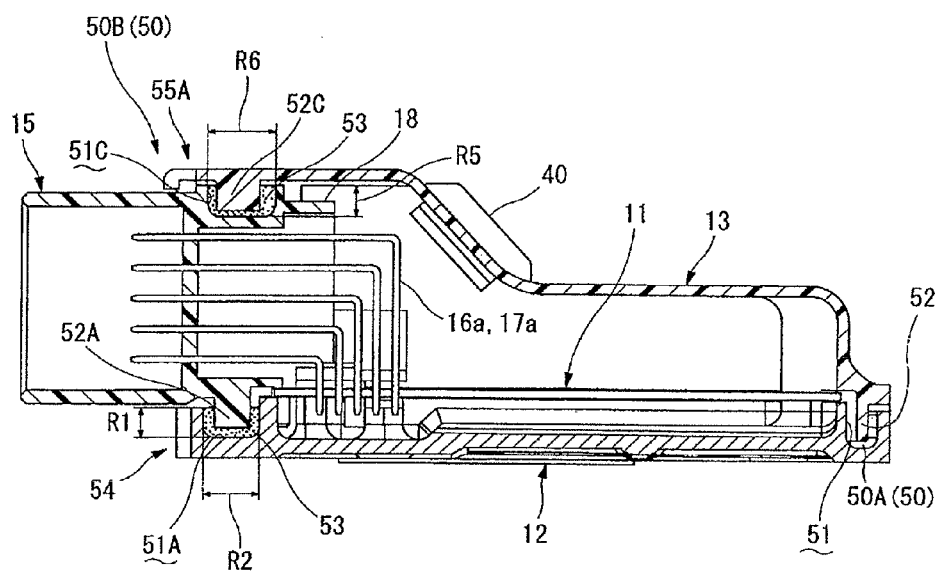
FIG. 7 is a sectional view showing the seal structure of the connector part, of the second embodiment.
Figure 8:
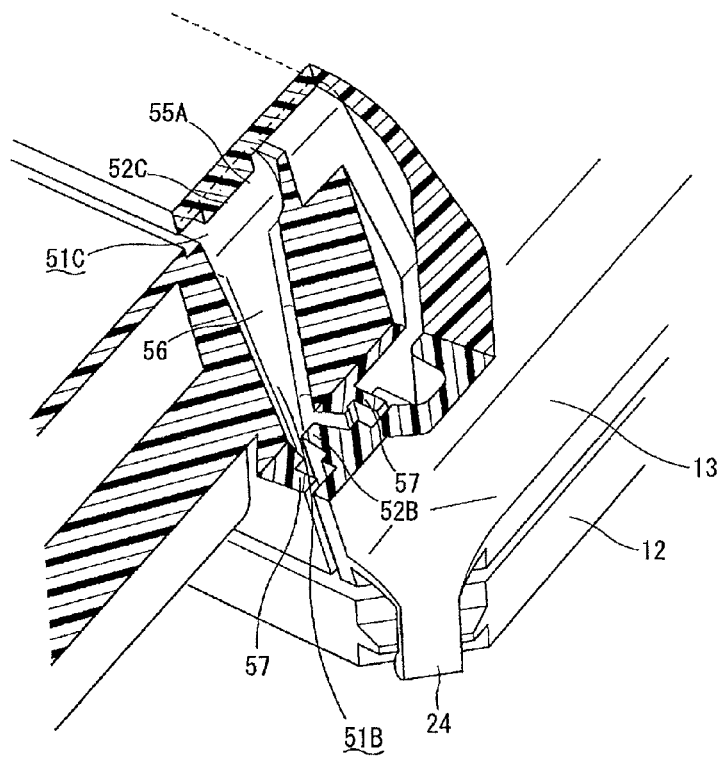
FIG. 8 is a perspective view showing the seal structure of the connector part, with parts of the cover and the connector shown by cutaway, of the second embodiment.

FIGS. 6 to 8 show a seal structure for the electronic control device of a second embodiment. The same components as the first embodiment are denoted by the same reference numbers, and an explanation of these components is omitted here.

In the first embodiment shown in FIG. 1 to FIG. 5C, the connector upper surface side shallow bottom portion 55 is sealed by the flat surface seal structure in which there is no seal groove and no protruding line. However, in this second embodiment, a seal groove 51C and a protruding line 52C are provided also at a shallow bottom portion 55A. More specifically, a pair of ribs 57A having a predetermined height are provided on an upper surface of the joining base 18 of the connector 15, and the seal groove 51 is formed between the both ribs 57A. These ribs 57A smoothly continue to the ribs 57 provided at both sides of the connector 15.

As shown in FIG. 7, a depth R5 of the seal groove 51C of the shallow bottom portion 55 (55A) is set to be smaller (shallower) than the depth R1 of the seal groove 51A of the deep bottom portion 54 (namely, R5<R1). Further, a width R6 of the seal groove 51 (51C) of the shallow bottom portion 55 (55A) is set to be large (i.e. R6>R2) as compared with the width R2 of the seal groove 51A of the deep bottom portion 54 so that the seal length of the connector seal portion 50B is constant between the shallow bottom portion 55 (55A), the deep bottom portion 54 and the connecting portion 56.

Regarding the connecting portion 56, as positions of the seal groove and the protruding line get closer to the deep bottom portion 54 from the shallow bottom portion 55, the depths of the seal groove and the protruding line are set to be gradually larger (deeper), and the widths of the seal groove and the protruding line are set to be gradually smaller so that the seal length is constant between the shallow bottom portion 55 (55A), the deep bottom portion 54 and the connecting portion 56.

The second embodiment also has the same function and effect as the first embodiment. Although the size in the thickness direction of the housing slightly increases by the depth R5 of the seal groove 51C of the shallow bottom portion 55 (55A) as compared with the first embodiment, since the shallow bottom portion 55 (55A) is also provided with the seal groove 51C and the protruding line 52C, the sealing performance can be further improved by the fact that the U-shaped gap between the seal groove 51C and the protruding line 52C is surely filled with the sealant.

Although the seal structure for the electronic control device according to the present invention has been explained on the basis of the first and second embodiments, the present invention is not limited to these embodiments. For instance, the shallow bottom portion could be provided on both upper and lower surfaces in the thickness direction of the connector 15, and the deep bottom portion and the connecting portion could be provided at both sides of the connector 15. In this case, shapes of the two shallow bottom portions might be the same. Alternatively, one of the shallow bottom portions could employ the flat surface seal structure having no seal groove, and the other could be provided with a seal groove that is shallower than that of the deep bottom portion.

Further, the shapes of the seal groove and the protruding line are not limited to the above embodiments. For instance, the shape in cross section of the gap between the seal groove and the protruding line, filled with the sealant, might be a zigzag shape.

The entire contents of Japanese Patent Application No. 2011-205473 filed on Sep. 21, 2011 are incorporated herein by reference.

Although the invention has been described above by reference to certain embodiments of the invention, the invention is not limited to the embodiments described above. Modifications and variations of the embodiments described above will occur to those skilled in the art in light of the above teachings. The scope of the invention is defined with reference to the following claims.

What is claimed is:

1. A seal structure for an electronic control device having a circuit board to which, at one side thereof, a connector is fixed and a housing having a pair of members that sandwich the connector in a thickness direction, and a part of the connector being exposed to an outside of the housing and a remaining part of the connector and the circuit board being housed in a watertight space of an inside of the housing, the seal structure comprising:

a seal portion formed at a fitting surface portion between an outer peripheral surface of the connector and an inner peripheral surface of the housing in a circumferential direction of the connector, and provided with a seal groove formed at one side of the outer peripheral surface of the connector and the inner peripheral surface of the housing and a protruding line formed at the other side, a gap defined by fitting of the protruding line and the seal groove being filled with a sealant, and the seal portion having
  (a) a deep bottom portion where a seal groove having a predetermined depth is formed;
  (b) a shallow bottom portion whose seal groove is set to be shallower than the seal groove of the deep bottom portion; and
  (c) a connecting portion which connects the deep bottom portion and the shallow bottom portion, and a width of the seal groove of the shallow bottom portion being set to be large as compared with the deep bottom portion so that a seal length is constant between the deep bottom portion, the shallow bottom portion and the connecting portion, and as a position of a seal groove of the connecting portion gets closer to the deep bottom portion from the shallow bottom portion, a depth of the seal groove of the connecting portion being set to be gradually larger, and a width of the seal groove of the connecting portion being set to be gradually smaller.

2. The seal structure for the electronic control device as claimed in claim 1, wherein:
the shallow bottom portion is sealed by a flat surface seal structure in which there is no seal groove.

3. The seal structure for the electronic control device as claimed in claim 1, wherein:
the shallow bottom portion is provided on one surface of upper and lower surfaces in a thickness direction of the connector, and the deep bottom portion is provided on the other surface of the connector, and
the connecting portion is provided on both side surfaces of the connector.

* * * * *